United States Patent [19]

Saulgeot et al.

[11] Patent Number: 4,816,961
[45] Date of Patent: Mar. 28, 1989

[54] ELECTRICAL SWITCH, IN PARTICULAR FOR THE CONTROL OF CAP OUTFITS AND FITTINGS

[75] Inventors: Jean-Michel Saulgeot, Lucinges; Gérard Lepine, Ambilly; Claude Caillon, Collonges sous Saleve, all of France

[73] Assignee: DAV, Annemasse, France

[21] Appl. No.: 101,450

[22] Filed: Sep. 28, 1987

[30] Foreign Application Priority Data

Oct. 2, 1986 [FR] France ............... 86 13740

[51] Int. Cl.⁴ ............................... H01H 47/00
[52] U.S. Cl. ................... 361/142; 361/395; 200/293
[58] Field of Search ............ 361/142, 395, 399, 415, 361/350, 351; 200/61.62, 61.71, 303, 243, 292, 293; 307/10 R, 141, 10 LS; 335/202; 439/74, 75

[56] References Cited

U.S. PATENT DOCUMENTS

| 4,136,269 | 1/1979 | Weidler | 200/243 |
| 4,370,565 | 1/1983 | Hayden | 307/141 |
| 4,446,505 | 5/1984 | Long et al. | 439/75 |
| 4,661,792 | 4/1987 | Watkins | 361/412 |
| 4,715,822 | 12/1987 | Stribel | 361/412 |

FOREIGN PATENT DOCUMENTS

| 2717372 | 11/1977 | Fed. Rep. of Germany . |
| 3135139 | 3/1983 | Fed. Rep. of Germany . |
| 3441337 | 5/1985 | Fed. Rep. of Germany . |
| 472170 | 6/1969 | Switzerland . |

Primary Examiner—L. T. Hix
Assistant Examiner—David M. Gray
Attorney, Agent, or Firm—George H. Gerstman; Garrettson Ellis

[57] ABSTRACT

The switch comprises, incorporated in its casing (2), an upper circuit board (16) which carries a control electronic circuit (18) and a lower circuit board (24) which carries power components, such as relays (26), for the feed power supply of the apparatus to be controlled. Both superposed boards (16, 24) are linked together, mechanically and electrically, by linking pillars (40). Application to the automatic control of a window lifting device or to the delay control of window heating device on cars.

11 Claims, 2 Drawing Sheets

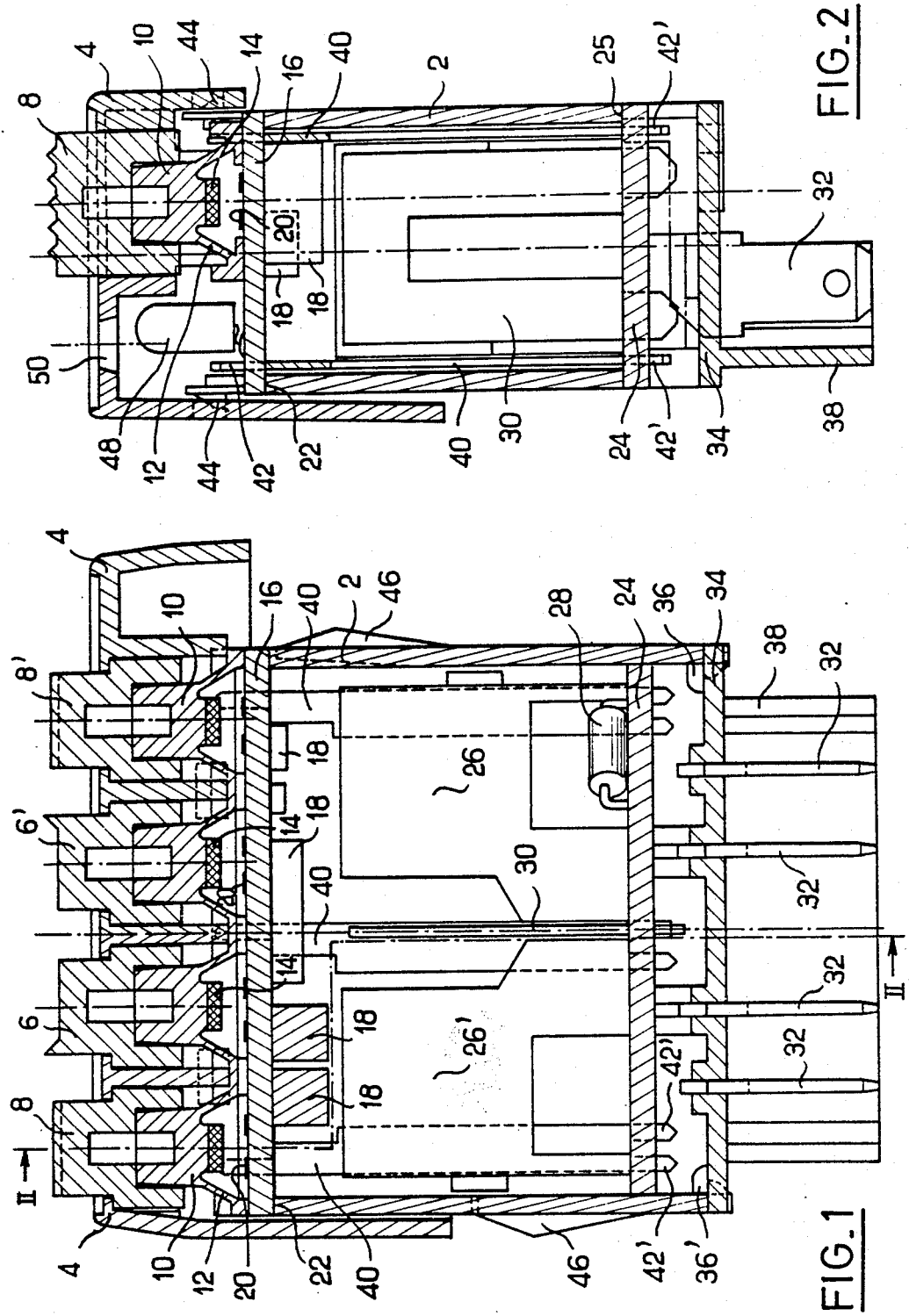

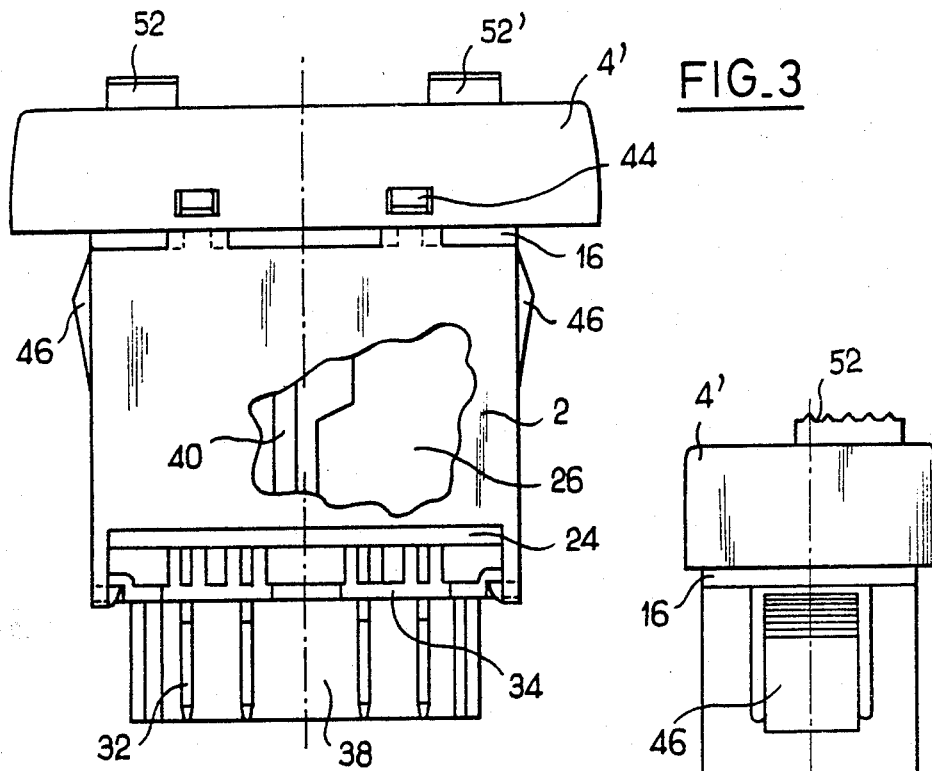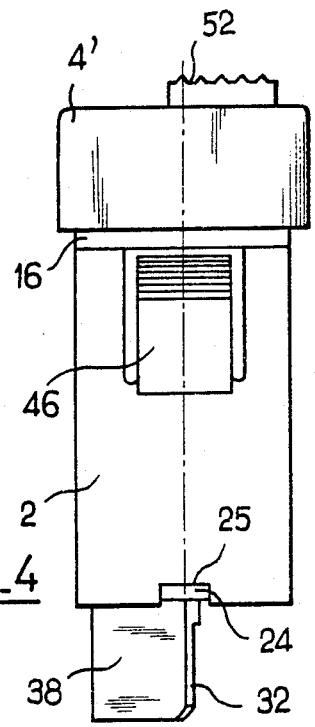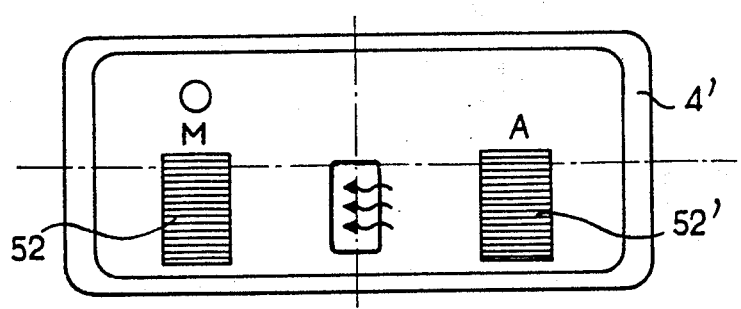

ELECTRICAL SWITCH, IN PARTICULAR FOR THE CONTROL OF CAP OUTFITS AND FITTINGS

The instant invention relates to an electrical switch and, more particularly, to a switch which makes up a set of electrical switching device, especially for the control of outfits and fittings in cars.

It is well known that more and more electrical outfits and fittings are mounted on cars, a great number of which needs for its control, due to a rather high demand in current, a set comprising a manual switching device for weak currents (for example, a break switch) arranged within the user's reach, and a power circuit comprising relays (electromagnetic, static ones) or power transistors.

Moreover, the operating of some of these outfits and fittings is now monitored by function control electronic circuits. Thus, it is possible for example, to provide for an electronic delayed action, a control by briefly pressing on a switch key, a selection among several operating functions, a gradual control through pulses, the detection and taking over of various parameters, and so on.

A few examples of the invention embodiment are the automatic control of the window lifting device, or the delay control of the window heating device.

The control sets for such devices then comprise three units : a manual switching device for weak currents, or switch, strictly speaking—an electronic part of function control—switching devices for high currents or power circuits (relays) to control the load.

Up to now, the last two units have been each arranged in a casing (or sometimes in one common casing) this or these casing(s) being connected to the manual switch by bundles of wiring and, sometimes, have been connected together by another bundle of wiring, and to the load.

As a result, this design requires major connections and a connecting wiring called "connectic" between the units making up the whole set of the switches, which brings about a rather high cost compared to the cost of the devices alone, especially when single controls or plain functions are involved.

On the other hand, the assembling of this "connectic" device on a car requires a certain time of labor cost and due to this linking "connectic" the reliability is reduced. The instant invention aims to make up for those drawbacks, thanks to a new design of the various elements which makes it possible to obtain a compact switch set.

The object of the instant invention is a switch comprising a casing and at least one manual control device, such as a key, the switch comprising, incorporated in its casing, two superposed circuit boards the upper board carrying at least electronic components which make up a function control electronic circuit for weak current ; the lower board carries a power circuit comprising at least one switching device for high current, especially a relay, as well as connection devices, such as connecting l u g s for junction to the apparatus to be controlled.

Thanks to the instant invention, the various units of the switching set are amalgamated in one casing (that of the switching set itself).

The arrangement of the function control and power circuits into 2 levels enables the switch casing to have a limited overall surface, not greater than the overall surface of a standard switching device without the management or power function; then, this makes it possible for interchangeable arrangement in the locations usually designed for recessed housing on the dashboard or similars.

Compared to a standard switch device, the switch according to the invention is more bulky depthwise, but, in most case, no space restriction is required in this direction.

Both circuits boards are preferably linked together by means of metallic pillars which insure electrical connections between the circuits of both boards.

Thanks to a preferred arrangement method, the upper circuit board carries, on its upper area, conductive tracks making up stationary contacts which cooperate with the mobile contact(s) carried by the key(s) of the switch, the electroni components of the function control circuit being fixed on the opposite face, that is, the lower area, of the same circuit board.

The instant invention will be more understandable by reading the detailed description which follows and by studying the enclosed drawings which show, as a non restrive example, various embodiment of the invention.

FIG. 1 is a section view of a switch device according to the invention for a car lifting window device.

FIG. 2 is a section view according to line II—II of FIG. 1.

FIG. 3 is a raised plan view, with some portions being taken off, of another embodiment of the switch device for the delay control of a window heating device.

FIG. 4 is an end view of same switch.

FIG. 5 is a view from above of same switch.

The switch shown in FIGS. 1 and 2 comprises a casing 2 capped in its upper area with an upper cover 4 with apertures for the passage the guiding of the manual control keys. Casing 2 is a plastic molded piece, tubular-sleeve-shaped with a rectangular section.

According to the e m b o d i m e n t shown, the switch comprises four keys : two middle keys 6, 6′ for the direct lifting and lowering control of the window, two side keys 8, 8′ for the lifting and lowering function, called automatic, through pulses on either of these keys obtained by brief presses.

The keys are hollow on their lower portion and are fit together with the raised parts 10 of a blister diaphragm 12, each raised part 10 carrying on its lower portion a conductive chip 14, in a classical way.

The switch comprises, integrated in its casing 2, a function control electronic circuit which is carried by an upper circuit board 16. In the embodiment example shown for the control of a window lifting device, this electronic circuit can have for functions the automatic cut-off of the motor at end of stroke, the keeping of a signal resulting from a pulse on a key, the overriding selection of a control over another one, etc...

This function control electronic circuit comprises a certain number of component 18 (condensers, transistors, operational amplifiers ...) which are assembled on the lower face of board 16, by means of down-hand welding on this face.

The upper face of board 16 carries contact tracks 20 facing the conductive chips 14 of the diaphragm 12. The board 16 is made up of a double face printed circuit with electric pinch leads between faces (metal-coated holes) and it rests onto the upper edges 22 of the casing 2 to which it is fixed.

A second stage, or power stage, is also integrated to the casing of the switch ; this stage is carried by a lower circuit board 24. That circuit board 24 is made up of a single face printed circuit the thickness in copper of which is adapted to the high currents to be conveyed to the output. The board 24 rests on recesses 25 on the lower area of casing 2.

In the case of a window lifting device, the power stage may comprise two electromagnetic relays (or static relays) 26, 26', one for the lifting function, another one for the lowering function, which are fitted on the upper face of board 24, the inductors (or similar units) of which are energized by weak intensity signals produced by the function control circuit.

The upper face of board 24 can also carry one or several standard electronic components 28 as well as power components, such as a resistive shunt 30 for the detection of intensity consumed by the apparatus (such as a motor for window lifting device) to be controlled. In the example shown on FIGS. 1 and 2, this resistive shunt 30 is a U-shaped flat piece, cut out of a striped resistive metal, which is located between the two relays 26, 26'.

A very small bulkiness is thus obtainable, which further helps the integration in the switch casing of the weak current control circuit and of the power circuit.

On the lower board 24, connection plug 32 are welded, on similar junction devices of the plug-in type which project from the lower face of the board 24, for their junction to a matching female connector.

Those plugs 32 go through the bottom 34 of casing 2, this bottom being a molded piece which is fixed by means of detents at points 36, 36' on the lower portion of the casing. The bottom 34 is extended downwards by a part 38 insuring the guiding and the polarizing of the connector to be plugged.

Both superposed circuit boards 16 and 24 are connected together, mechanically and electrically, by means of linking pillars or spacers 40, for example three pillars on each side. These pillars are flat, cut out of a strip of metal and welded on each of the two circuits carried by boards 16 and 24. The ends of each pillar are teeth-shaped (single or double) 42, 42' which go through boards 16 and 24 to insure their location and which are welded on the suitable portions of the printed circuits.

Once they have been fixed to casing 2, boards 16, 24 and bottom 34 make up a compact set which can be capped with an upper cover 4, of any kind, located onto the casing by clips by means of teeth 44, which are protuberant at the upper portion of casing 2. The casing 2 also comprises clip side plates 46, made through molding for embedding into a recess of the switch panel.

As it is shown on FIGS. 1 and 2, the arrangement of the function control circuit and of the power circuit on the two superposed boards 16 and 24 makes it possible for the assembly located in casing 2 to have a front area that is not greater than the useful front area, carrying keys 6, 6', 8, 8' of the switch; that means that the switch according to the invention can be assembled in place of a standard switch, the height only being more important.

The upper circuit board 16 can also carry an electroluminescent lamp or diode 48 which lights, directly or through a light beam, function pilot signs 50 provided for on cover 4.

On FIGS. 1 and 2, relays or electromagnetic microrelays 26, 26' have been shown, as devices for power switching, but these components can be replaced by power semi-conductors, carried by board 24 and equipped with a heat dissipation radiator.

Of course, some of the keys 6, 6', 8, 8' of the push type can be replaced by the tumbler key(s) of a standard reversing switch.

Another embodiment of the switch according to the invention is shown on FIGS. 3, 4 and 5 for use of the control, with a delayed action, of the rear window heating device. The same units have the same reference numbers as on FIGS. 1 and 2. Casing 2 is similar to the one above explained and is designed as a standard piece for the various kinds of switches.

The upper cover 4' has a different shape from cover 4 shown in FIGS. 1 and 2, but it is fixed by clips to casing 2 with the same teeth 44 which are parts of the casing.

The upper cover 4' is provided for two keys On/Off 52, 52'. The delay starting up is obtainable by briefly pressing on key 52. The rest condition is obtained either at the end of the delayed action or by briefly pressing on key 52'.

The function control electronic circuit carried by the upper board 16 then works as a maintaining device for the keeping of a brief command or delay command for a specific lapse of time. In that case, the power circuit comprises only one micro-relay 26, carried by lower board 24.

As an example, it can be pointed out that in case of FIGS. 1, 2 as in case of FIGS. 3 to 5, the casing 2 can have, as boards 16 and 24 have, a length L of about 36 mm and a width 1 of about 18 mm, which enables to insert the switch according to the invention in place of a standard switch.

Of course, the switch can be adjusted for any other control of function and power other than those described hereinabove. So, the switch can be provided for insuring a progressive control which is obtained from two control keys "+" and "−" or, several kinds of controls can be integrated into the switch, the control keys being then arranged as a keyboard.

We claim:

1. In a switch for the control of an electrical device the improvement comprising, in combination, a first circuit board and a second circuit board stacked together in spaced, overlying relation, said first board carrying a control electronic circuit for relatively low electrical current, the second board carrying a power circuit comprising at least one means for switching a relatively high electrical current, said second board also carrying connecting means for joining to the apparatus to be controlled, and electrically conductive linking pillar means joining the first and second boards together in firmly fixed relation to each other, said linking pillar means also providing electrical connection between the respective circuits of said first circuit board and second circuit board, whereby the switching means may be controlled by the control electronic circuit.

2. A switch according to claim 1 which includes a casing comprising a tubular member of rectangular cross-section, said circuit boards resting and being secured against end edges of said casing.

3. A switch according to claim 1 in which said first circuit board defines components of said control electronic circuit on the face of said first circuit board which faces the second circuit board, and the face of said first circuit board which faces away from said second circuit board carries conductive metal track means, plus mobile contact means for providing electrical connection between said track means, said mobile contact means being movable into said electrical connection and movable away from said electrical connection by the operation of key means.

4. A switch according to claim 3 in which said contact means are made up of conductive chips carried by a blister diaphragm.

5. A switch according to claim 1 for the control of a car window lifting device, in which said power circuit switching means of the second circuit board comprises a pair of relay means, said second board also carrying a flat, resistive shunt arranged between said pair of relay means.

6. A switch according to claim 1 for the delay control of a window heating device including delay means defined by the electronic circuit carried by said first board, and wherein said second board carries a single relay means for connection between a feed power supply and a window heating device.

7. The circuit board assembly of claim 1 in which said pillars define teeth members at each of their ends which penetrate the respective boards to which they are connected and which are welded to printed circuits carried on said boards.

8. A switch for the control of an electrical device, said switch comprising a first circuit board and a second circuit board rigidly positioned together in side-by-side, facing, spaced, electrically interconnected relation, said first board carrying a control electronic circuit for relatively low current, said second board carrying a power circuit comprising at least one switching device for relatively high current, said second circuit board also defining means for electrical interconnection with the apparatus to be controlled, the face of said first circuit board which is opposed to the second circuit board carrying at least a pair of conductive metal track means as part of said control circuit, and contact means to close the circuit between respective conductive track means, said contact means being movable between circuit closing relation and spaced relation by the action of manually operated key means.

9. A switch according to claim 8 in which the movable contact means are made up of electrically conductive chips carried by a blister diaphragm.

10. A switch according to claim 8 adapted for controlling a car window lifting device, the switching circuit on the second of said circuit boards comprising a pair of relay means, said board also carrying a flat, resistive shunt arranged between said relay means.

11. A switch according to claim 8 adapted for providing a delay control of a window heating device, including circuit means for providing said delay function carried on the first circuit board, said second circuit board carrying a single relay for connection in a circuit between a power supply and a window heating wire.

* * * * *